(12) United States Patent
Burger

(10) Patent No.: US 9,702,902 B2
(45) Date of Patent: Jul. 11, 2017

(54) PRINTED CIRCUIT BOARD COMPRISING AN ELECTRODE CONFIGURATION OF A CAPACITIVE SENSOR

(75) Inventor: Stefan Burger, Munich (DE)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/128,998

(22) PCT Filed: Jun. 20, 2012

(86) PCT No.: PCT/EP2012/061900
§ 371 (c)(1),
(2), (4) Date: Dec. 23, 2013

(87) PCT Pub. No.: WO2012/175580
PCT Pub. Date: Dec. 27, 2012

(65) Prior Publication Data
US 2014/0139240 A1  May 22, 2014

(30) Foreign Application Priority Data

Jun. 24, 2011 (DE) ........................ 10 2011 078 077

(51) Int. Cl.
*G01R 27/26* (2006.01)
*G01R 1/04* (2006.01)
(Continued)

(52) U.S. Cl.
CPC ........... *G01R 1/0408* (2013.01); *H05K 1/162* (2013.01); *H03K 17/962* (2013.01);
(Continued)

(58) Field of Classification Search
CPC .... G01R 27/26; G01R 27/2605; G01R 15/16; G01R 27/04; G01R 15/040816;
(Continued)

(56) References Cited

U.S. PATENT DOCUMENTS 5,726,581 A    3/1998  Vranish .......................... 324/688
5,896,032 A *  4/1999  Yagi et al. ..................... 324/660
(Continued)

FOREIGN PATENT DOCUMENTS

CN          1847797 A    10/2006   ............. G01D 11/24
DE          4006119 A1    8/1991   ........... H03K 17/955
(Continued)

OTHER PUBLICATIONS

International Search Report and Written Opinion, Application No. PCT/EP2012/061900, 8 pages, Dec. 14, 2012.
(Continued)

*Primary Examiner* — Arleen M Vazquez
*Assistant Examiner* — Steven Yeninas
(74) *Attorney, Agent, or Firm* — Slayden Grubert Beard PLLC

(57) ABSTRACT

A printed circuit board (P) has an evaluation device (E) and an electrode configuration of a capacitive sensor, wherein the electrode configuration has at least two electrodes, one arranged above the other and spaced apart from each other, which each are formed by portions of at least one electrically conductive layer of the printed circuit board (P), and wherein at least one electrode of the electrode configuration is coupled with the evaluation device (E) via a conductor path of the printed circuit board (P). Furthermore, an electric handheld device may have at least one such printed circuit board (P).

28 Claims, 7 Drawing Sheets

(51) Int. Cl.
*H05K 1/16* (2006.01)
*H03K 17/96* (2006.01)

(52) U.S. Cl.
CPC ............... *H03K 2017/9602* (2013.01); *H03K 2217/960765* (2013.01); *H03K 2217/960775* (2013.01); *H05K 2201/0919* (2013.01); *H05K 2201/09672* (2013.01); *H05K 2201/10151* (2013.01)

(58) Field of Classification Search
CPC .. G06F 3/044; G06F 2203/04107; G06F 1/16; G06F 1/19; G06F 3/0416; H03K 17/962; H03K 17/9622; H03K 17/955; H03K 2017/9602; H03K 2217/960765; H03K 2217/960775; H01L 23/5222; H01L 23/5223; H01L 23/5225; H01L 23/5226; H05K 1/162; H05K 1/0296; H05K 1/0298; H05K 2201/10151; H05K 2201/09672; H05K 2201/0919
USPC ....... 324/658, 686, 679, 661, 667, 629, 660, 324/663, 687, 688; 361/752; 345/173, 345/174; 340/870.37
See application file for complete search history.

(56) References Cited

U.S. PATENT DOCUMENTS

| | | | |
|---|---|---|---|
| 5,923,101 A | 7/1999 | Peterson et al. | 307/104 |
| 6,492,911 B1* | 12/2002 | Netzer | 340/870.37 |
| 8,156,826 B2 | 4/2012 | Abert et al. | 73/862.626 |
| 8,482,303 B2 | 7/2013 | Van Gastel et al. | 324/679 |
| 9,124,273 B2 | 9/2015 | Unterreitmayer | |
| 2002/0154039 A1 | 10/2002 | Lambert et al. | 341/33 |
| 2004/0252032 A1 | 12/2004 | Netzer | 340/870.37 |
| 2009/0146827 A1 | 6/2009 | Wuerstlein et al. | 340/657 |
| 2009/0161325 A1* | 6/2009 | Kirmayer | 361/752 |
| 2010/0271049 A1* | 10/2010 | Van Gastel et al. | 324/679 |
| 2011/0018560 A1* | 1/2011 | Kurashima | 324/679 |
| 2011/0163763 A1 | 7/2011 | Osaki et al. | 324/658 |
| 2011/0175626 A1 | 7/2011 | Lee et al. | 324/629 |
| 2011/0205172 A1* | 8/2011 | Kitada | G06F 3/044 345/173 |
| 2012/0262385 A1* | 10/2012 | Kim | G06F 3/044 345/173 |
| 2012/0280698 A1* | 11/2012 | Oya | 324/658 |
| 2013/0176693 A1 | 7/2013 | Güte | 361/749 |
| 2014/0210489 A1* | 7/2014 | Ivanov et al. | 324/658 |

FOREIGN PATENT DOCUMENTS

| | | | | |
|---|---|---|---|---|
| DE | 19823190 A1 | 10/1999 | | G06F 23/26 |
| DE | 20307931 U1 | 9/2004 | | G01D 5/24 |
| DE | 102004023285 B3 | 7/2005 | | E05F 15/00 |
| DE | 202006009188 U1 | 10/2007 | | G01V 3/10 |
| DE | 102007058088 A1 | 6/2009 | | G01V 3/12 |
| DE | 102008019178 A1 | 11/2009 | | G01J 1/42 |
| DE | 102010019841 A1 | 11/2011 | | G09F 9/00 |
| EP | 1164240 A2 | 12/2001 | | E05B 65/20 |
| EP | 1487104 A2 | 12/2004 | | G01V 3/08 |
| EP | 2243906 A2 | 10/2010 | | E05B 1/00 |
| JP | 2006084318 A | 3/2006 | | G01B 7/00 |
| JP | 2013513840 A | 4/2013 | | G01B 7/00 |
| TW | 200701854 A | 1/2007 | | H05K 3/46 |
| TW | 201015050 A | 4/2010 | | G01B 7/14 |
| WO | 89/08352 A1 | 9/1989 | | H03K 17/955 |
| WO | 97/01835 A1 | 1/1997 | | E05F 15/00 |
| WO | 2012/175580 A2 | 12/2012 | | H03K 17/955 |

OTHER PUBLICATIONS

European Office Action, Application No. 12730884.9, 4 pages, Jul. 15, 2015.
Chinese Office Action, Application No. 201280039513.2, 7 pages, Dec. 24, 2015.
Taiwan Office Action, Application No. 101122553, 9 pages, Mar. 3, 2016.
Chinese Office Action, Application No. 201280039513.2, 5 pages, Aug. 29, 2016.
Japanese Office Action, Application No. 2014516332, 7 pages, Jul. 4, 2016.
Chinese Office Action, Application No. 201280039513.2, 3 pages.
German Summons to Attend Oral Proceedings, Application No. 102011078077.7, 7 pages.

* cited by examiner

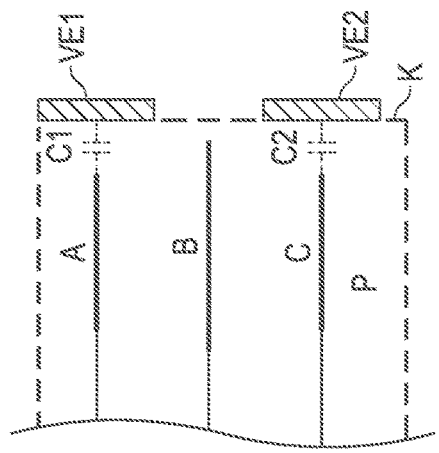
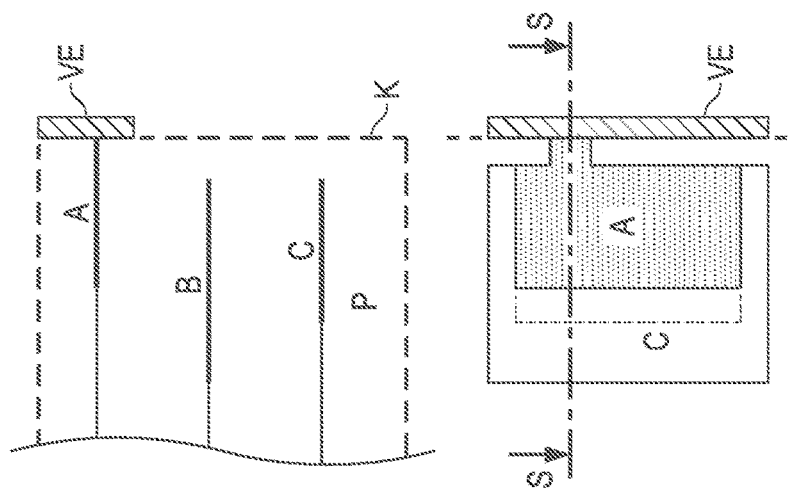

PRINTED CIRCUIT BOARD COMPRISING AN ELECTRODE CONFIGURATION OF A CAPACITIVE SENSOR

CROSS-REFERENCE TO RELATED APPLICATIONS

This application is a U.S. National Stage Application of International Application No. PCT/EP2012/061900 filed Jun. 20, 2012, which designates the United States of America, and claims priority to DE Patent Application No. 10 2011 078 077.7 filed Jun. 24, 2011. The contents of which are hereby incorporated by reference in their entirety.

TECHNICAL FIELD

The invention relates to a printed circuit board, which comprises an evaluation device and at least one electrode configuration of a capacitive sensor, as well as to an electric handheld device, which comprises at least one printed circuit board according to the invention.

BACKGROUND

Electric handheld devices, for example mobile radio units, computer mice, remote controls or the like increasingly are provided with capacitive touch sensors and proximity sensors in order to detect a contact of the handheld device by a hand or an approach of a hand towards the handheld device, respectively, and to activate a predetermined device function at a contact with or an approach towards the handheld device.

Capacitive sensors, such as those used in electric handheld devices, substantially consist of an evaluation device and of a number of electrodes or sensor electrodes, respectively, coupled with the evaluation device. In doing so, the electrodes are manufactured or assembled separately and are arranged on a rigid or flexible printed circuit board specifically provided for the electrodes. The electrodes or the printed circuit board, respectively, on which the electrodes are arranged, are connected via plug-in connections to the evaluation device, which also is arranged on a printed circuit board.

In doing so, it is a disadvantage that additional cost is incurred for the printed circuit boards, on which the electrodes are arranged, and for the plug-in connections. In very cost-sensitive applications these additional cost may lead to abstain from the use of a capacitive sensor. In addition, the above described design of a capacitive sensor device leads to the fact that also the effort and the cost of manufacturing of an electric handheld device are increasing, because additional working steps are required for manufacturing in order to, on the one hand, produce the printed circuit boards comprising the electrodes arranged thereon and, on the other hand, to couple the electrodes or the printed circuit board, respectively, with the evaluation device.

In order to reduce the time and effort and the cost for manufacturing capacitive sensor devices, in particular for handheld devices, it is known to simplify the design and the manufacturing process of the printed circuit boards comprising the electrodes arranged thereon. For example, whenever possible only one-sided printed circuit boards without a ground surface on the backside are used. Furthermore, it is feasible to produce the electrodes by means of applying electrically conductive color onto a cost-effective carrier material. In a further alternative embodiment, for example, the electrodes may be realized as pierced sheet metal parts.

Furthermore, it is known to reduce the time and effort and the cost for manufacturing the capacitive sensor device by providing cost-effective alternatives instead of the above mentioned plug-in connections, for example springs or electrically conductive elastomers as connecting elements in order to connect the electrodes or the printed circuit board, on which the electrodes are arranged, with the evaluation device.

This way, the material cost of a capacitive sensor device may be reduced, however, the time and effort and the cost, respectively, for manufacturing the capacitive sensor device substantially remain the same, so that by means of the measures mentioned the effort for manufacturing an electric handheld device comprising at least one capacitive sensor cannot be reduced substantially.

SUMMARY

According to various embodiments, solutions can be provided for a capacitive sensor device, in particular for electric handheld devices, which provide a simpler and more cost-effective manufacturing process of a capacitive sensor and an electric handheld device as compared to conventional systems.

According to various embodiments, a printed circuit board may comprise an evaluation device and at least one electrode configuration of a capacitive sensor, wherein the electrode configuration has at least two electrodes arranged one above the other and spaced apart from each other, which each are formed by portions of at least one electrically conductive layer of the printed circuit board, and wherein at least one electrode of the electrode configuration is coupled with the evaluation device via a conductor path of the printed circuit board.

The electrodes of the electrode configuration may be coupled with the evaluation device via a conductor path of the printed circuit board.

The electrode configuration may have a third electrode, arranged between an upper electrode and a lower electrode, wherein one electrode of the upper electrode and the lower electrode is operable as a transmitting electrode and the respective other electrode of the upper electrode and the lower electrode is operable as a receiving electrode, and wherein the third electrode may be operated as a compensation electrode and/or as a ground electrode.

The electrode configuration may also have a third electrode arranged between an upper electrode and a lower electrode, wherein the upper electrode and the lower electrode, respectively, may be operated as a ground electrode and wherein the third electrode may be operated as a loading electrode.

The electrode configuration may have at least one further electrode, which is arranged between the upper electrode and the lower electrode of the electrode configuration, and wherein one of the two electrodes arranged between the upper electrode and the lower electrode may be operated as a compensation electrode and the respective other one of the two electrodes arranged between the upper electrode and the lower electrode may be operated as a ground electrode.

The at least one electrode configuration may be arranged on the printed circuit board at the edge region thereof.

The arrangement of the at least one electrode configuration at the edge region on the printed circuit board may be selected such that at least one electrode of the electrode configuration extends all the way to the completion border of the printed circuit board.

At least one electrode of the electrode configuration may be arranged at least partially circumferential around the printed circuit board.

At least two electrodes of the electrode configuration may be formed by portions of the same electrically conductive layer of the printed circuit board.

At least one of the electrodes of the electrode configuration or at least one further electrode may be formed by means of an electrically conductive layer arranged at the surface at the edge of the printed circuit board.

The printed circuit board may have at least two electrode configurations arranged at the edge region, preferably at two opposite completion borders of the printed circuit board, wherein at least one electrode of the one electrode configuration may be operated as a transmitting electrode and at least one electrode of the other electrode configuration may be operated as a receiving electrode.

At least two electrodes of the electrode configuration may be loaded with different electric alternating signals.

The evaluation device may be operated in at least two operating modes, wherein depending on the operating mode of the evaluation device a number of the electrodes of the electrode configuration each is loaded with an electric alternating signal.

The printed circuit board may be a double-sided printed circuit board, wherein at least one of the electrodes of the electrode configuration is arranged at the upper side of the printed circuit board and the remaining electrodes of the electrode configuration are arranged at the lower side of the printed circuit board.

The printed circuit board at least in part may be formed flexible.

Arranged on the printed circuit board may be at least one further electrode, which is not directly coupled with the evaluation device and which may be coupled with at least one electrode of the electrode configuration in a capacitive or galvanic manner.

The at least one further electrode may be formed by portions of an electrically conductive layer of the printed circuit board.

Furthermore, an electric handheld device may comprise at least one printed circuit board as mentioned above.

The handheld device may comprise electrically conductive layers at the inner side of the housing, wherein at least one of these electrically conductive layers may be coupled in a capacitive or galvanic manner with at least one electrode of the electrode configuration of the printed circuit board according to various embodiments.

For example, the electric handheld device may be a smart phone, a mobile radio unit, a cell phone, a computer mouse, a remote control, a digital camera, a mobile mini computer, a tablet-PC or another electric handheld device.

BRIEF DESCRIPTION OF THE DRAWINGS

Further details and characteristics of the invention as well as specific exemplary embodiments result from the following description together with the drawing.

FIG. 7a shows a printed circuit board according to an embodiment comprising an electrode arranged at a sidewall of the printed circuit board, which is coupled with the electrode configuration in a galvanic manner;

FIG. 7b shows a printed circuit board according to an embodiment comprising two electrodes arranged at a side wall of the printed circuit board, each of which are coupled capacitively with the electrode configuration.

DETAILED DESCRIPTION

Figure 1A:
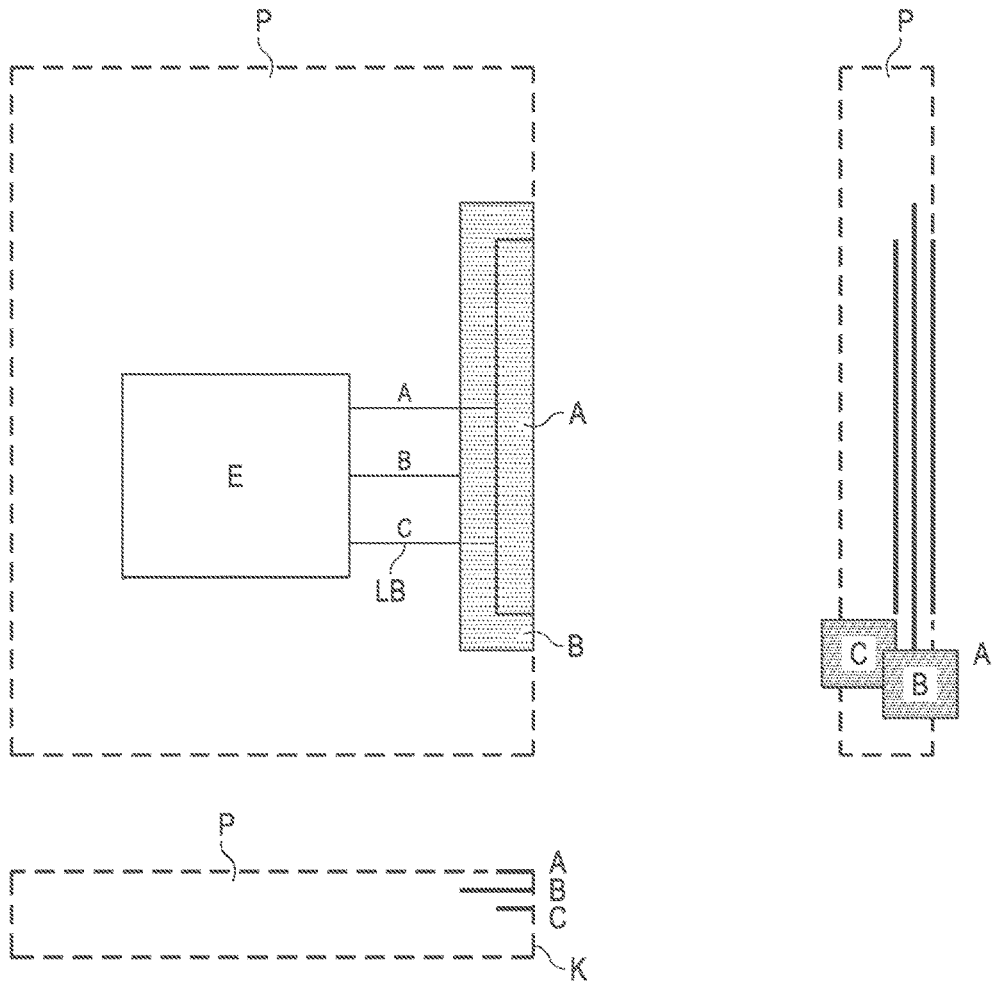
FIG. 1a shows a printed circuit board comprising an electrode configuration according an embodiment, in a top view, a view from the front and a side view.

According to various embodiments, the electrode configuration of a capacitive sensor is integrated into the printed circuit board, which also comprises the evaluation device of the capacitive sensor. The electrode configuration has at least two electrodes arranged one upon the other and spaced from each other, wherein the electrodes each are formed by portions of an electrically conductive layer of the printed circuit board, which comprises several electrically conductive layers. The electrodes of the electrode configuration each are coupled with the evaluation device of the capacitive sensor via a conductor path, wherein also the conductor paths preferably are formed by portions of an electrically conductive layer of the printed circuit board. At least one electrode is loaded by an electric alternating signal, so that an electric alternating field is formed at this electrode.

In a further embodiment not shown here, the electrode configuration of a capacitive sensor may be integrated into a first printed circuit board, while the evaluation device of the capacitive sensor is arranged on a second printed circuit board. Also in this case the electrode configuration has at least two electrodes arranged one upon the other and spaced from each other, wherein the electrodes each are formed by portions of an electrically conductive layer of the first printed circuit board, which has several electrically conductive layers. The two printed circuit boards, for example, may be connected to each other via plug-in connections. Alternatively, the first printed circuit board also may be coupled directly with the evaluation device via a plug-in connection.

By means of the electrodes, which are arranged one upon the other and spaced from each other, a stacked or layered sensor electrode or electrode unit, respectively, is provided, which is integrated into the printed circuit board.

The electrodes of the capacitive sensor device such, in an advantageous manner, may be manufactured on the printed circuit board in one working step together with the other conductive structures (for example conductor paths). According to that, manufacturing separate boards comprising sensor electrodes arranged thereon does not apply. Furthermore, no connecting elements, as for example plug-in connections or springs, are required to connect the electrodes with the printed circuit board, on which the evaluation device of the capacitive sensor is arranged, which on the one hand leads to a significant cost reduction and on the other hand leads to a simpler production of the capacitive sensor system.

Preferably, so called multi-layer printed circuit boards are chosen, which have at least two electrically conductive layers. In an embodiment, also printed circuit boards may be used, which have a number of conductive layers on both sides (upper side and lower side) of the printed circuit board, as for example shown with regard to FIG. 6.

Preferably, the electrode configuration of the stacked or layered electrodes is arranged on the printed circuit board at the edge region. This means that the electrodes each are formed by areas at the edge regions of an electrically conductive layer of the printed circuit board. This way, the electrodes of the electrode configuration each arranged at the edge region extend all the way to the completion border of the printed circuit board, as for example shown with regard to FIG. 1b.

However, it is advantageous when only one electrode of the electrode configuration extends all the way towards the completion border of the printed circuit board, while the other electrodes of the electrode configuration have a certain distance, about 0.2 mm, from the completion border of the printed circuit board. This way it is avoided that during milling at the edge region of the printed circuit board electrically conductive chips may create a short between two electrodes. However, also several electrodes may extend all the way towards the completion border of the printed circuit board provided that electrically conductive material may not create a short between the electrodes. With an electrode distance of about 0.5 mm or more of the electrodes extending all the way towards the completion border of the printed circuit board, it also may be ensured during milling at the edge region of the printed circuit board that electrically conductive chips cannot create a short between two electrodes.

The electrode configuration and the electrodes of the electrode configuration, respectively, are arranged at the printed circuit board such that the electric alternating field created by them preferably propagates towards the side, especially preferred propagates only towards the side and in particular may be affected by an approach from the side.

In the following, with regard to FIG. 1a to FIG. 7b, shown are exemplary embodiments of a printed circuit board each comprising three or four electrodes and electrode layers, respectively, arranged one upon the other and spaced from each other, this is to mean in a stacked manner. According to various embodiments, however, also provided may be electrode configurations comprising only two electrodes and electrode layers, respectively, arranged one upon the other or comprising more than four electrodes arranged one upon the other.

Also, several electrodes may be formed by means of portions of the same electrically conductive layer of the printed circuit board, so that several electrodes may be arranged in an electrode layer of the electrode configuration. These electrodes of an electrode layer may be arranged at different edges of the printed circuit board.

FIG. 1a shows a first exemplary embodiment of a printed circuit board P in a top view, a side view and a frontal view. The printed circuit board P (multi-layer PCB) substantially is comprised of several electrically conductive layers between which each an electrically isolating material is arranged. The electrically conductive layers are provided for manufacturing the electrodes as well as the conductor paths. Arranged on the printed circuit board P is an evaluation device E of a capacitive sensor device. Arranged in addition to the evaluation device E may be further electric and electronic components, for example a microcontroller of an electric handheld device.

Provided at the edge region on the printed circuit board P are three electrodes A, B and C, which are arranged one upon the other and are spaced from one another, so that the electrodes together form a layered or stacked sensor electrode or electrode unit. The electrodes themselves each are formed by portions of an electrically conductive layer of the printed circuit board. In the example shown in FIG. 1a the printed circuit board P comprises at least three electrically conductive layers, by which in each case an electrode of the electrode configuration is formed. As can be seen from the front view and in the side view, the lower electrode C is formed by a portion of the lower electrically conductive layer of the printed circuit board P, the upper electrode A is formed by a portion of the upper electrically conductive layer of the printed circuit board P, and the electrode B arranged between the electrode A and the electrode C is formed by a portion of an electrically conductive layer of the printed circuit board P, which is arranged between the lower conductive layer and the upper conductive layer. The electrodes A, B and C each are coupled with the evaluation device of the capacitive sensor by means of a conductor path LB. The conductor paths LB preferably also are formed by the respective electrically conductive layer of the printed circuit board P.

However, the upper electrode A not necessarily has to be formed by the uppermost or outermost electrically conductive layer of the printed circuit board P. The electrodes of the electrode configuration also may be formed by means of electrically conductive layers of the printed circuit board P located in the inside. For example, the three electrodes of an electrode configuration according to various embodiments comprising three electrodes in a 5 layer multi-layer-PCB may be formed by means of the second, third and fourth electric conductive layer of the printed circuit board P.

As can be seen from FIG. 1a, the lower electrode C and the upper electrode A substantially have the same dimensions, while the electrode B arranged between the electrode A and the electrode C is wider as well as also longer than the electrodes A and C. For example, the electrodes A and C each may have a width of 2 mm and a length of about 40 mm, while the electrode B may have a width of 4 mm and a length of about 45 mm. Of course the electrodes also may be larger or smaller than the electrodes shown here, which in the end depends on the specific application or on the specific requirements for the capacitive sensor device.

The electrically conductive layers of the printed circuit board P and therefore also the electrodes of the electrode configuration may comprise copper. The distance between the individual electrodes, for example, may be 150 μm and the thickness of the individual electrodes, for example, may be 35 μm, wherein here the distances and the thicknesses of the electrodes as well depend on the specific requirements for the capacitive sensor device.

With the electrode configuration shown in FIG. 1a the electrode A is used as a transmitting electrode, the electrode B is used as a compensation electrode and the electrode C is used as a receiving electrode. The evaluation device E may be designed to load the electrode A as well as the electrode B each with an electric alternating signal and to tap an electric signal at the electrode C. The electric alternating signals supplied to the electrodes A and B may be different with respect to phase and/or amplitude. Alternatively, the electrode B also may be used as ground electrode or may be coupled with the ground of the evaluation device.

Figure 1B:
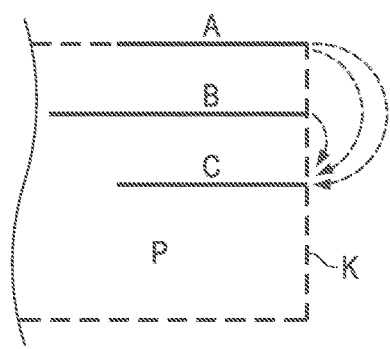
FIG. 1b shows a section of a printed circuit board comprising an electrode configuration arranged on the printed circuit board at the edge region.

FIG. 1b shows an edge section of a printed circuit board P according to various embodiments comprising an electrode configuration. As can be seen here, the electrodes A, B and C of the electrode configuration each extend all the way to the completion border K of the printed circuit board P. This way it is feasible that an object approaching the printed circuit board P at the edge region, for example a finger, manipulates the electric flux lines forming at the edge region, which may be detected or analyzed by means of the evaluation device E.

In the example shown in FIG. 1b the electrode A is operated as the transmitting electrode, the electrode C is operated as the receiving electrode and the electrode B is operated as the compensation electrode, as already described with respect to FIG. 1a. When the transmitting electrode A as well as the compensation electrode B are loaded with an electric alternating signal, than an electric alternating field substantially arranged at the edge region is emitted from them, which is coupled into the receiving electrode C. Preferably, the electric alternating field substantially is emitted perpendicular with respect to the completion border K of the printed circuit board P. This way it is also ensured that a finger approaching laterally towards the printed circuit board manipulates the electric alternating field, which, depending on the embodiment of the capacitive sensor device, results in a reduction or an increase of the capacitive coupling between the electrode A and the electrode C. A finger approaching the edge region of the printed circuit board from above or below, however, only very little or not at all affects the electric alternating field such formed.

Figure 2:
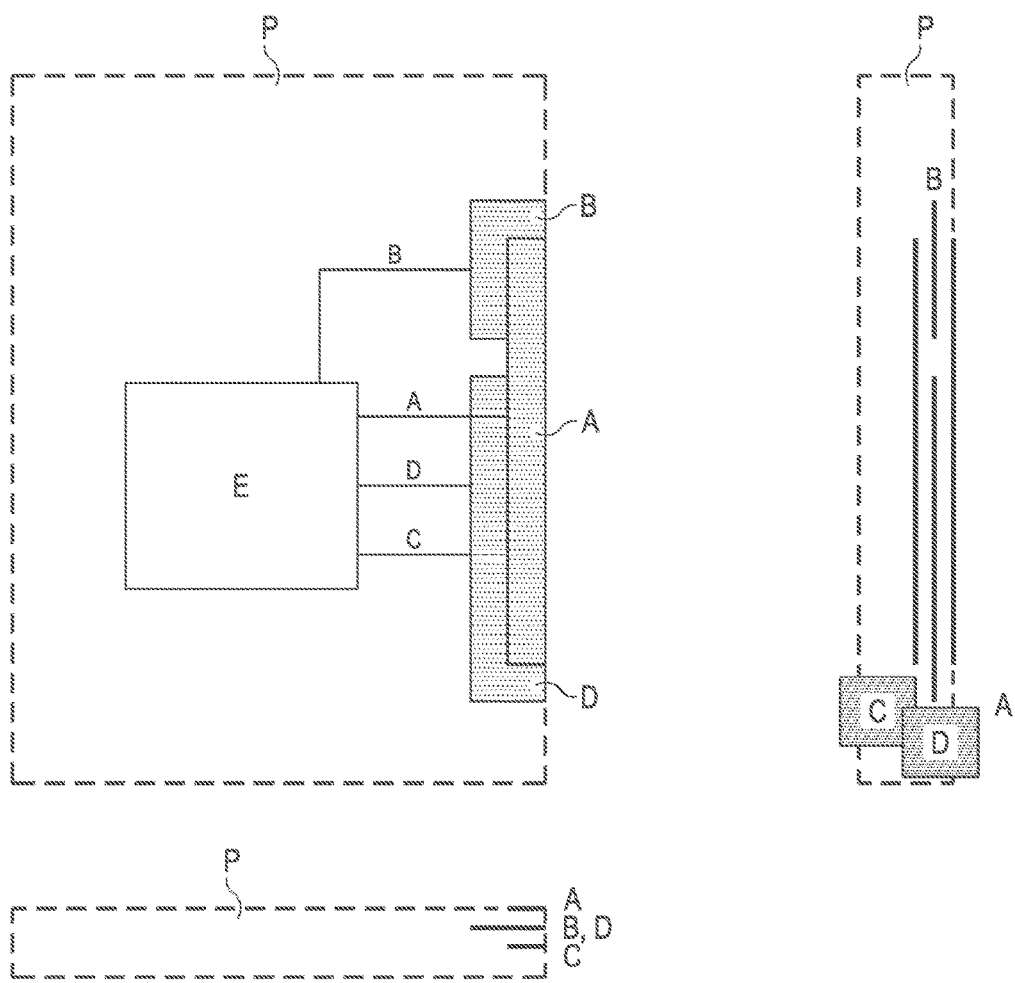
FIG. 2 shows a further example of a printed circuit board comprising an electrode configuration in a top view, a view from the front and a side view.

FIG. 2 shows a further exemplary embodiment of a printed circuit board comprising an evaluation device E and an electrode configuration of a capacitive sensor. Here as well, the electrodes of the electrode configuration are arranged one upon the other and spaced from each other. Furthermore, the electrodes of the electrode configuration are arranged at the edge region of the printed circuit board P.

In contrast to the examples shown in FIG. 1a and FIG. 1b the electrode configuration here has four electrodes A, B, C and D, wherein the electrodes B and D are formed by portions of the middle electrically conductive layer of the printed circuit board P arranged between the upper electrically conductive layer and the lower electrically conductive layer.

In the exemplary embodiment shown in FIG. 2 the electrode B is operated as compensation electrode and the electrode D is operated as ground electrode. Preferably, the evaluation device E may be operated in several operating modes, so that using the electrode configuration shown here, on the one hand a calibration of the capacitive sensor device and on the other hand a detection of an approach or a contact may be carried out. During the calibrating action an electric signal may be supplied to the compensation electrode B, wherein the function substantially is described as with regard to FIG. 1b. During the detection of an approach or a contact the electrode B also may be operated as ground electrode.

During the detection of an approach or a contact the capacitive coupling between the electrode A and the electrode C of the electrode configuration is measured. When in addition a second electrode configuration is arranged at the opposite edge region of the printed circuit board P, also a capacitive coupling between the electrode A of the one electrode configuration and the electrode C of the other electrode configuration may be measured, which then is advantageous, when, for example, a grasping of the handheld device is to be detected.

Figure 3:
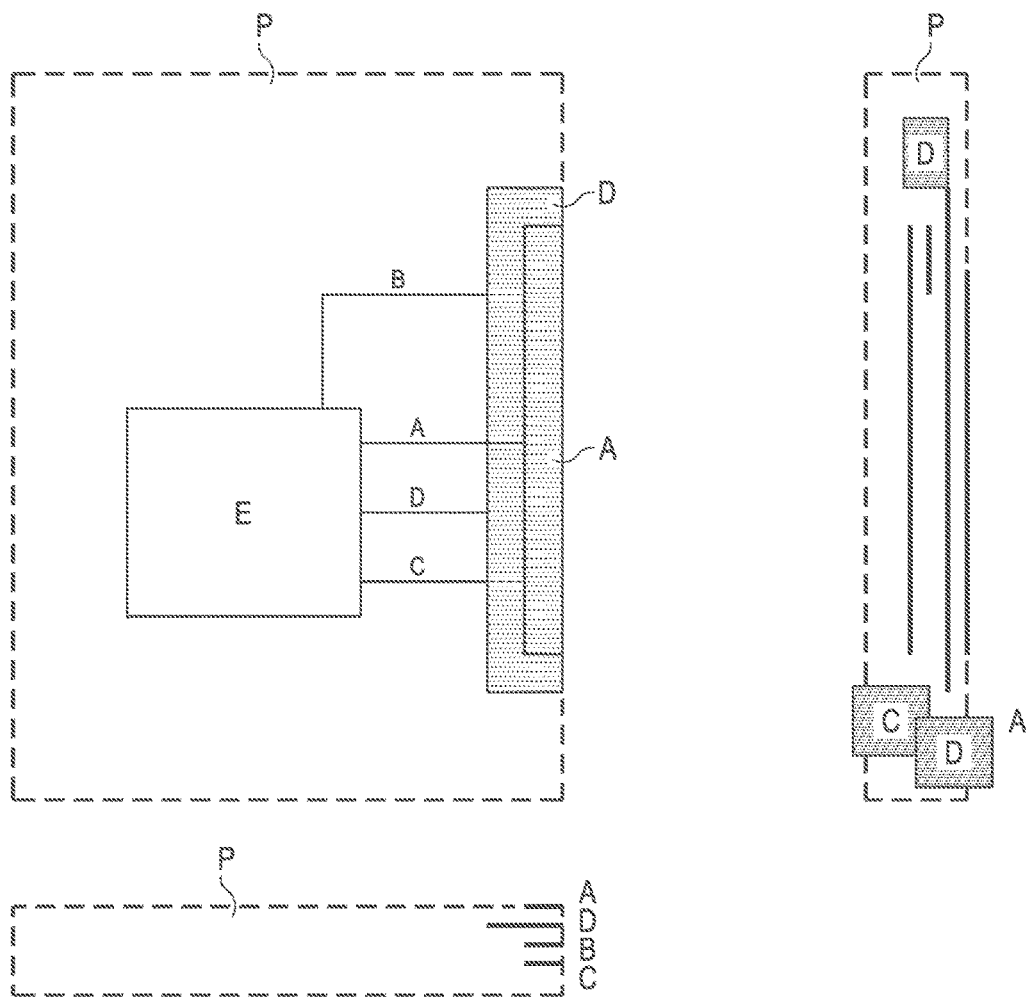
FIG. 3 shows yet a further example of a printed circuit board comprising an electrode configuration in a top view, a view from the front and a side view.

FIG. 3 shows a printed circuit board according to various embodiments comprising an evaluation device E and an electrode configuration, which comprises four electrodes A, B, C and D arranged one upon the other and spaced from each other. In contrast to the exemplary embodiment shown in FIG. 2 the electrodes B and D here each are formed by a portion of two electrically conductive layers arranged one upon the other, so that substantially an electrode configuration comprising four electrode layers is provided. The electrode B here is operated as a compensation electrode and the electrode D is operated as a ground electrode, wherein the effect substantially equals the one as described with respect to FIG. 2.

Figure 4:
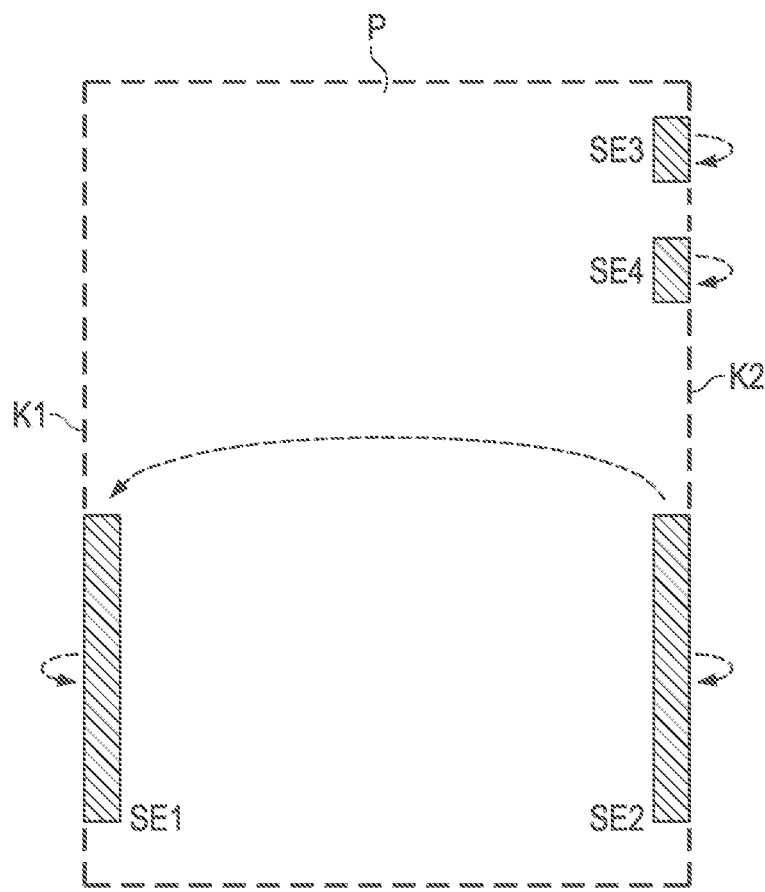
FIG. 4 shows an example of a printed circuit board comprising a number of electrode configurations arranged on the printed circuit board.

FIG. 4 shows a printed circuit board P comprising four layer electrodes or electrode configurations SE1 to SE4, respectively, arranged on the printed circuit board P at the edge region. In this case, the electrode configurations SE1 to SE4 may be designed as shown with respect to FIG. 1a to FIG. 3.

The electrode configurations SE1 and SE2 may be provided to detect a grasping of an electric handheld device as already described here with respect to FIG. 2. During the detection of a grasping, for example, the electrode configuration SE2 may be operated as a transmitter and the electrode configuration SE1 may be operated as a receiver. With the electrode configuration SE2 operated as a transmitter some or all electrodes may be loaded with an electric alternating signal, so that an electric alternating field is emitted at some or all electrodes that is coupled into the receiver, i.e. into the electrode configuration SE1, via the hand grasping the handheld device. With the electrode configuration SE1 operated as a receiver some or all electrodes may be operated as receiving electrodes.

Furthermore, the two layer electrodes and the electrode configurations SE1 and SE2, respectively, also may be provided for detecting an approach towards the respective electrode configuration, as for example described with respect to FIG. 1b.

It is advantageous when the evaluation device to which the electrode configurations SE1 and SE2 are connected may be operated in at least two different operating modes, wherein in one operating mode a grasping of the handheld device and in the other operating mode an approach towards the respective electrode configuration may be detected. Depending on the respective operating mode the electrodes of an electrode configuration each may be loaded with different electric alternating signals.

For example, the electrode configurations SE3 and SE4 may be used as capacitive key buttons, wherein the two electrode configurations each may be operated as described with respect to FIG. 1b.

Figure 5:
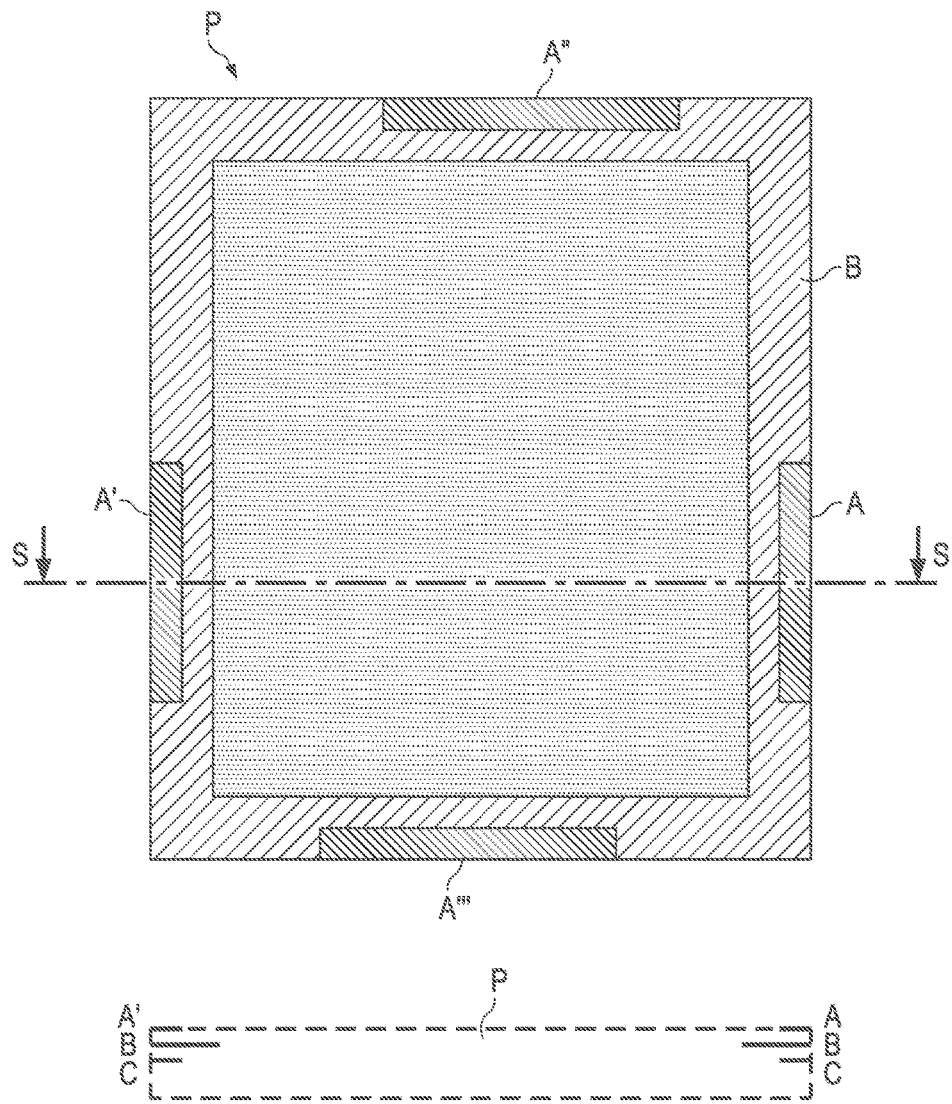
FIG. 5 shows a printed circuit board comprising an electrode configuration according to an embodiment, which circumferentially is arranged at the edge region at the printed circuit board.

FIG. 5 shows an exemplary embodiment of a printed circuit board P comprising an electrode configuration of a capacitive sensor, wherein the middle electrode B is arranged circumferential around the printed circuit board P and at the edge region on the printed circuit board P. The upper electrode in part is arranged circumferential around the printed circuit board P and arranged at the edge region on the printed circuit board P, wherein the upper electrode is formed by the electrode segments A, A' A" and A'". Alternatively, it is feasible that only some of the electrodes of the electrode configuration are arranged in a circumferential manner around the printed circuit board P. Furthermore it is feasible that the electrodes of the electrode configuration are arranged only partially circumferential around the printed circuit board P, for example in cases where predefined areas of the edge region of the printed circuit board P may not be provided with electrically conductive layers, for example for reasons of production processes.

Figure 6:
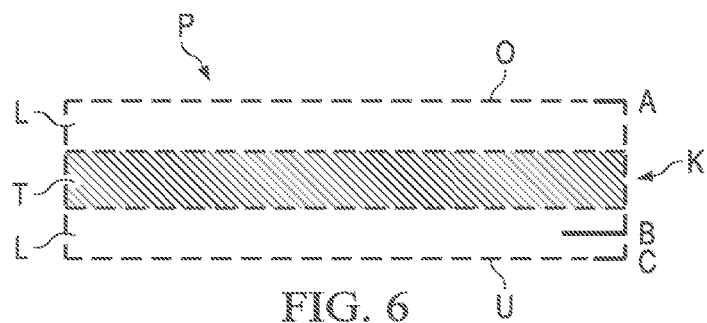
FIG. 6 shows an exemplary embodiment of a printed circuit board comprising an electrode configuration, wherein a part of the electrodes is arranged at the upper side of the printed circuit board and the remaining part of the electrodes is arranged at the lower side of the printed circuit board.

FIG. 6 in a sectional drawing shows a further exemplary embodiment of a printed circuit board P. The printed circuit board P here is comprised of an electrically non-conductive carrier material T, which comprises a number of electrically conductive layers L each at the lower side U as well as at the upper side O. With a printed circuit board such laminated on both sides the electrode configurations according to various embodiments may be formed by the electrically conductive layers at the upper side of the printed circuit board as well as by the electrically conductive layers at the lower side of the printed circuit board.

Alternatively, as shown in FIG. 6, it is also feasible that some electrodes of the electrode configuration are formed by electrically conductive layers on the upper side O of the printed circuit board P and the other electrodes of the electrode configuration are formed by electrically conductive layers at the lower side U of the printed circuit board P. For example, the electrode A of an electrode configuration according to various embodiments may be formed by portions of the uppermost electrically conductive layer at the upper side O of the printed circuit board P and the electrodes B and C each may be formed by portions of the two uppermost electrically conductive layers at the lower side U of the printed circuit board P.

With respect to FIG. 1a to FIG. 6 respective printed circuit boards P are described in which the electrodes of the respective electrode configuration in each case are formed by portions of an electrically conductive layer of the printed circuit board P. In addition to the electrodes formed by portions of the electrically conductive layers of the printed circuit board P, which are coupled with the evaluation device of the capacitive sensor via the conductor paths LB, also further electrodes may be provided, which are not directly coupled with the evaluation device E. These further electrodes each also may be formed by portions of an electrically conductive layer of the printed circuit board P. Alternatively, these further electrodes also may be formed by means of an electrically conductive material additionally applied to the printed circuit board P. These further electrodes preferably are arranged relative to the electrodes of the electrode configuration such that they may be brought into a capacitive coupling with at least one electrode of the electrode configuration. In doing so, for example the effective surface or capacity of the respective electrode of the electrode configuration may be changed. However, these further electrodes also may be coupled in a galvanic manner with at least one electrode of the electrode configuration according to various embodiments.

FIG. 7a in a top view and in a cross-sectional view shows a printed circuit board according to various embodiments comprising an additional electrode VE arranged at a sidewall of the printed circuit board. For example, this additional electrode VE may be applied as electrically conductive lacquer. Furthermore, the electrode VE here is coupled with the upper electrode A of the electrode configuration galvanically, so that the effective electrode surface of the electrode A is increased, which corresponds to an amplification of the electric alternating field emitted at the electrode A in case the electrode A is operated as a transmitting electrode. When the electrode A is operated as a receiving electrode, the additional electrode VE increases the effective coupling surface.

In order to couple the additional electrode VE with the electrode A of the electrode configuration galvanically it may be advantageous to extend the electrode A at least in part all the way to the completion border K of the printed circuit board P as can be seen in the top view. Furthermore, the width of the additional electrode VE and its position relative to the electrode A preferably are chosen such that it does not cover the other electrodes B and C.

Also provided may be further additional electrodes at the sidewall of the printed circuit board, wherein each additional electrode may galvanically be coupled with a respective electrode of the electrode configuration.

FIG. 7b shows a printed circuit board according to various embodiments comprising two electrodes VE1 and VE2 additionally arranged at a sidewall of the printed circuit board. The electrode VE1 is coupled capacitively (capacity C1) with the upper electrode A and the electrode VE2 is coupled capacitively (capacity C2) with the lower electrode C. Furthermore, also a third additional electrode may be provided, which may be coupled capacitively with the middle electrode B. The capacitive coupling with the electrodes of the electrode configuration has the advantage over the galvanic coupling (see FIG. 7a) that the electrodes of the electrode configuration do not have to be extended all the way to the completion border K of the printed circuit board P and that during milling of the printed circuit board P there is no risk that the electrically conductive particles create a short between several electrodes of the electrode configuration.

Furthermore, the width of the additional electrodes VE1 and VE2 as well as their position relative to the electrode A and the electrode C, respectively, preferably are chosen such that they do not cover the middle electrode B.

In a further embodiment not shown here some of the additional electrodes arranged at a sidewall of the printed circuit board may be coupled galvanically with electrodes of the electrode configuration and some of the additional electrodes arranged at a sidewall of the printed circuit board may be coupled capacitively with electrodes of the electrode configuration. Which type of coupling (galvanic, capacitive or a combination of both) in fact is used substantially depends on the specific requirements for the capacitive sensor system.

In addition, electrically conductive structures of other components, which may be arranged close to the printed circuit board P, may be coupled capacitively with electrodes of the electrode configuration. This way, for example, a conductive layer applied to an inner side of the housing may be coupled capacitively with electrodes of the electrode configuration on the printed circuit board P, which may be an advantage during the production of a device, which at least is comprised of the printed circuit board P and the housing.

Figure 8:
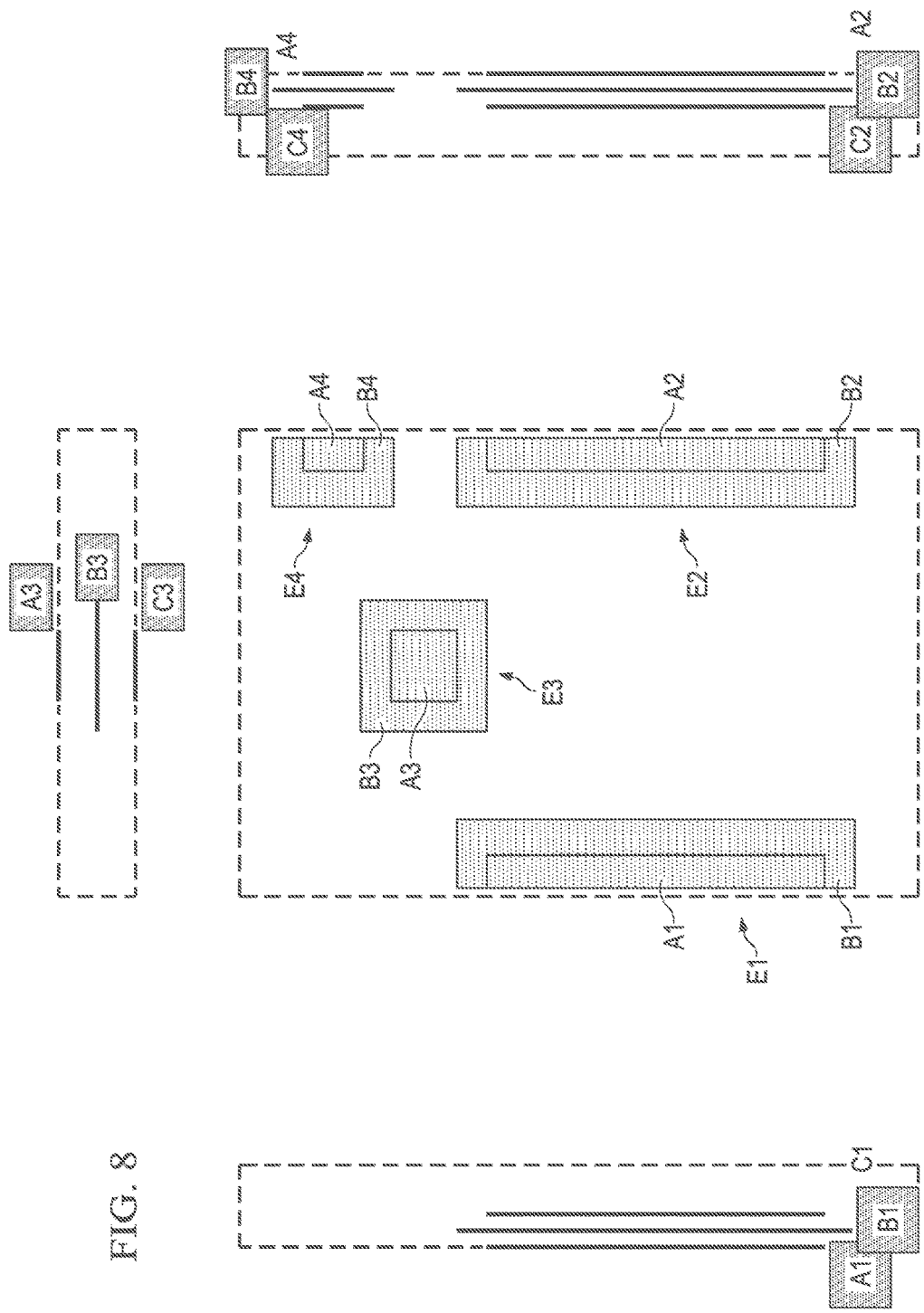
FIG. 8 shows a printed circuit board according to an embodiment comprising four electrode configurations.

FIG. 8 shows a printed circuit board according to various embodiments comprising four electrode configurations E1 to E4, which each are arranged on the printed circuit board as previously described. Here, the electrodes of the electrode configurations E1, E2 and E4 are formed by the three uppermost electrically conductive layers of the printed circuit board, respectively. The electrodes of the electrode configuration E3 here are formed by the uppermost, the lowest and an inner (i.e. inside lying) conductive layer of the printed circuit board. The electrode configurations E1 to E4 each may be operated and used, respectively, in different manners as described in the following. The evaluation device E is not shown here. The electrode configurations E1 to E4 may be coupled with a single evaluation device E.

Alternatively, a respective dedicated evaluation device may be provided for each electrode configuration.

Depending on the specific application the electrodes of the electrode configurations E1 to E4 may be operated in different ways. Depending on the requirements, each of the electrodes substantially may be operated as

- a transmitting electrode (an electric signal is supplied to the transmitting electrode, so that an electric alternating field is emitted from there),
- a compensation electrode (an electric signal is supplied to the compensation electrode, so that an electric alternating field is emitted from there. The supplied signal may be shifted in phase relative to the signal supplied to the transmitting electrode and/or may have a different amplitude),
- a receiving electrode (tapped at the receiving electrode is an electric signal, which preferably is analyzed and processed, respectively, by the evaluation device),
- a field measurement electrode (tapped at the field measurement electrode is an electric signal, which preferably is analyzed and processed, respectively, by the evaluation device), or as
- a loading electrode (at the loading electrode an electric signal is supplied, so that an electric alternating field is emitted from there, wherein the capacitive load of the loading electrode is detected and analyzed, respectively, by the evaluation device).

In the following specific application examples are described.

Example 1

In this example only the electrode configurations E1 and E2 are activated. The capacitive sensor device may be operated in three different operating modes, wherein the electrodes of the electrode configurations E1 and E2 are used differently depending on the operating mode.

The first operating mode is named "transmission mode". In this transmission mode the electrode A1 of the electrode configuration E1 is used as a transmitting electrode and the electrode A2 of the electrode configuration E2 is used as a receiving electrode. The electrodes B1 and B2 each are connected to ground. In the transmission mode the capacitive coupling between the two electrodes A1 and A2 is analyzed.

In the transmission mode the electrode A1 is loaded with an electric alternating signal, so that an electric alternating field is emitted from there. During an approach of a hand towards the electrodes A1 and A2 the electric alternating field emitted at the electrode A1 is coupled into the electrode A2 via the hand, so that a capacitive coupling between the electrode A1 and the electrode A2 is created, and a presently low capacitive coupling is increased. The capacitive coupling between the two electrodes A1 and A2 changes during a further approach of the hand towards the sensor device, so that a variation of the coupling capacity between the electrodes A1 and A2 may be used as an indication for the approach of a hand towards the sensor device. Since the electrode configurations E1 and E2 are arranged on two opposite sides of the printed circuit board also a grasping of a handheld device, in which the printed circuit board is arranged, may be detected.

The electrodes C1 and C2 are not used in this case. However, they also may be operated as a transmitting electrode (C1) and a receiving electrode (C2), respectively.

The second operating mode is named "loading mode". In the loading mode a capacitive load between an electrode and a reference ground is used for detecting the approach of a hand towards the electrode. A capacitive load means that a strength of an electric field effective from the electrode to the reference ground is increased by the approach of the electrically conductive hand and thus the capacity between electrode and reference ground increases. The capacitive load is a measure for the strength of an electric field effective between the electrode and the reference ground and is a measure for the capacity between electrode and reference ground, respectively.

In the second operating mode the electrode A1 of the first electrode configuration E1 is used as loading electrode, in order to detect an approach towards the electrode A1. The electrode B1 may be connected to ground. The electrode is not used. Correspondingly, also electrodes of the second electrode configuration E2 may be used. In an embodiment the electrode configurations E1 and E2 may be used as loading sensors alternatingly.

The third operating mode also is named transmission mode, wherein in this case, however, not the capacitive coupling between two different electrode configurations is detected, but the capacitive coupling between respective two electrodes of an electrode configuration is detected. In this example the capacitive coupling between two electrodes of the first electrode configuration E1 and between two electrodes of the second electrode configuration E2 is detected.

In the third operating mode the electrodes A1 and A2 each are operated as transmitting electrode, the electrodes C1 and C2 each are operated as receiving electrodes. The electrodes B1 and B2 may be connected to ground. An electric alternating field is emitted at the electrodes A1 and A2, respectively, which may be coupled into electrodes C1 and C2, respectively. Depending on the actual grounding conditions of the capacitive sensor device an approach of a hand towards the electrode configurations leads to a reduction or to an increase of the capacitive coupling between the electrodes A1 and C1, and A2 and C2, respectively, at the respective electrode configuration.

The received signal tapped at the respective receiving electrode C1 or C2 may be tested for meeting predefined tolerances so that in the third operating mode also a system test of the capacitive sensor device may be carried out.

Example 2

The electrode configurations E1, E2 and E3 may be provided to detect with an electric handheld device in which the printed circuit board according to various embodiments is arranged a grasping of the handheld device, wherein at the same time it may be detected if the handheld device is oriented towards the palm with its backside or with its front side.

To do so, the electrode A1 is used as transmitting electrode and the electrode A2 is used as receiving electrode. In order to increase the precision of detection also the electrodes C1 and C2 may be used as transmitting electrode and receiving electrode, respectively. The electrodes B1 and B2 may be connected to ground. By means of the transmitting electrode A1 (and C1, if applicable) and the receiving electrode A2 (and C2, if applicable) the capacitive coupling between the first electrode configuration E1 and the second electrode configuration E2 may be measured. During a grasping of the handheld device this capacitive coupling changes, so that it may be used as an indication for a grasping of the handheld device by a hand.

Furthermore, the electrodes A3 and C3 of the third electrode configuration E3 are used as field measurement electrodes, at which a received signal is scanned and analyzed. The electrode B3 is coupled with ground to substantially reach a capacitive decoupling of the electrode A3 from the electrode C3. The electrode A3 is arranged at the upper side of the printed circuit board, the electrode C3 is arranged at the lower side of the printed circuit board.

The electric alternating field emitted at the transmitting electrode A1 couples into field measurement electrode A3 and C3, respectively, via the hand grasping the handheld device. Depending on which side (upper side or lower side) of the handheld device is oriented towards the palm either the capacitive coupling between the electrode A1 and the electrode A3 or the capacitive coupling between the electrode A1 and the electrode C3 is greater.

Furthermore, it is feasible in this example to provide two operating modes. In the first operating mode only a grasping is detected. In the second operating mode it is only detected, which side of the handheld device is oriented towards the palm. Preferably, a switching from the first operating mode into the second operating mode only takes place when in fact a grasping is detected in the first operating mode. In the second operating mode then the electrode A2 (and the electrode C2, if applicable), which is operated as a receiving electrode in the first operating mode, also may be operated as a transmitting electrode.

In a further embodiment of this example a touch-sensitive button may be realized at a sidewall of the handheld device by using the fourth electrode configuration E4. To do so, the electrode A4 of the fourth electrode configuration E4 is used as a field measurement electrode. The electrode B4 may be connected to ground. The electric alternating field emitted at the transmitting electrode A1 (and at the electrode A2, if applicable) couples into the electrode A4 via the hand grasping the handheld device. In order to avoid erroneous activation it may be provided for that the electrode configuration E4 only then is activated, when a grasping has been detected. Furthermore, it may be advantageous to only then activate the electrode configuration E4 when the handheld device is oriented towards the palm with its backside.

It is also feasible that only one transmitting electrode A1 or A2 and only the field measurement electrode A4 are active to detect a simple actuation of the button.

Also, in an alternative embodiment only the electrode configuration E4 may be active, wherein in this case the electrode configuration either may be operated in transmission mode (A4—transmitting electrode, C4—receiving electrode) or in loading mode (A4—transmitting electrode) to realize a touch-sensitive button.

Example 3

Described in the following is an embodiment of the electrode configuration and the printed circuit board, respectively, in which at least one of the electrodes of the electrode configurations E1 to E4 is used as a compensation electrode.

Here, the electrode A1 is operated as a transmitting electrode and the electrode A2 is operated as a receiving electrode. The electrode C2 is operated as a compensation electrode. The electrodes B1 and B2 may be connected to ground.

The transmitting electrode A1 is loaded with an electric alternating signal. The compensation electrode C2 also is loaded with an electric alternating signal, which preferably has the waveform and the frequency of the electric alternating signal by which the transmitting electrode A1 is loaded. The electric alternating signal of the compensation electrode C2 may be shifted in phase with respect to the electric alternating signal of the transmitting electrode A1 and/or may have a different amplitude.

The electric alternating signal supplied to the transmitting electrode A1 is designed such that the electric alternating field emitted by the transmitting electrode A1 may be coupled into the receiving electrode A2. The electric alternating signal supplied to the compensation electrode C2 is designed such that the electric alternating field emitted by the compensation electrode C2 also may be coupled into the receiving electrode A2. By means of the electric alternating field emitted at the compensation electrode C2, which, if applicable, is shifted in phase with respect to the electric alternating field emitted by the transmitting electrode A1, the level of the electric alternating field reacting on the receiving electrode A2 is reduced or (virtually) deleted in the case of an superimposition with opposite phase.

By means of the approach of a hand towards the electrodes the electric alternating field present at the receiving electrode A2 is changed such that a current is generated in the receiving electrode A2, which is representative for the approach of a hand towards the electrodes.

In addition, also the electrode C1 of the first electrode configuration E1 may be used as a transmitting electrode.

In this embodiment according to example 3a grasping of the handheld device may be detected.

The principle described in example 3 also may be used for a single electrode configuration, for example for the electrode configuration E1. For example, the electrode A1 may be used as a transmitting electrode, the electrode C1 may be used as a receiving electrode and the electrode B1 may be used as a compensation electrode. Here, the mode of operation is the same as previously described.

Furthermore, in the example 3 also the third electrode configuration E3 may be provided for detecting if the handheld device is oriented towards the palm with its front side or its backside. To do so it may be sufficient to operate the electrode A1 as the transmitting electrode only. It may be advantageous to operate the capacitive sensor device in two operating modes, wherein in the first operating mode a grasping of the handheld device and in the second operating mode the orientation of the handheld device relative to the palm is detected. In the second operating mode the electrode C1 or C2, respectively, used as compensation electrode in the first operating mode may be used as a further transmitting electrode.

Furthermore, in example 3 also the fourth electrode configuration E4 may be provided for realizing a touch-sensitive button. In this case, the mode of operation is the same as described with respect to example 2. Furthermore, it may be advantageous here to operate the electrode C4 as compensation electrode.

The printed circuit board P according to various embodiments at least in part may be formed flexible.

What is claimed is:

1. A printed circuit board comprising an evaluation device and at least one electrode configuration of a capacitive sensor, wherein the at least one electrode configuration has at least two electrodes consisting of an upper electrode and a lower electrode arranged one above the other and spaced apart from each other, wherein each of the at least two electrodes can be operated as a transmitting electrode or as a receiving electrode, wherein each electrode of the at least two electrodes is formed by portions of at least one electrically conductive layer of the printed circuit board, and wherein the at least two electrodes are coupled with the evaluation device via a conductor path of the printed circuit board, wherein the at least one electrode configuration is arranged in and only extend within an edge region of the printed circuit board such that each of the at least two electrodes of the electrode configuration extends within the edge region of the printed circuit board to or near the edge of the printed circuit board wherein a respective surface region of the edge perpendicular to the at least one electrically conductive layer of the printed circuit board forms the capacitive sensor.

2. The printed circuit board of claim 1, wherein the electrodes of the at least one electrode configuration are coupled with the evaluation device via a conductor path of the printed circuit board.

3. The printed circuit board of claim 1, wherein the at least one electrode configuration has a third electrode arranged between the upper electrode and the lower electrode, wherein the upper electrode or the lower electrode is operated as a transmitting electrode and the respective other electrode is operated as a receiving electrode, and wherein the third electrode is operated as a compensation electrode and comprises a size larger than the size of either the one upper electrode and the one lower electrode.

4. The printed circuit board of claim 3, wherein the at least one electrode configuration has at least a fourth electrode, which is arranged between the upper electrode and the lower electrode of the at least one electrode configuration, and wherein the fourth electrode is a ground electrode.

5. The printed circuit board of claim 3, further comprising a fourth electrode, wherein at least two electrodes of the at least one electrode configuration are formed by parts of the same electrically conductive layer of the printed circuit board.

6. The printed circuit board of claim 1, wherein the at least one electrode configuration has a third electrode arranged between the upper electrode and the lower electrode, wherein the upper electrode or the lower electrode is operated as a ground electrode, and wherein the third electrode is operated as a loading electrode.

7. The printed circuit board of claim 1, wherein only one of the electrodes of the at least one electrode configuration extends all the way to the edge region of the printed circuit board.

8. The printed circuit board of claim 7, wherein remaining electrodes of the at least one electrode configuration have a distance from the edge of at least about 0.2 mm.

9. The printed circuit board of claim 1, wherein at least one electrode of the at least one electrode configuration at least partially is arranged circumferential around the printed circuit board and within the edge region of the printed circuit board.

10. The printed circuit board of claim 1, wherein at least one of the electrodes of the at least one electrode configuration or at least one further electrode is formed by an electrically conductive layer arranged within the edge region of the surface of the printed circuit board.

11. The printed circuit board of claim 1, wherein the printed circuit board has at least two electrode configurations each arranged only within respective edge regions, and wherein at least one electrode of one of the at least two electrode configurations is operable as a transmitting electrode and at least one electrode of a respective other one of the at least two electrode configurations is operable as a receiving electrode.

12. The printed circuit board of claim 11, wherein a first electrode configuration of the at least two electrode configurations is arranged at a first edge region of the printed circuit board and a second electrode configuration of the at least two electrode configurations is arranged at a second edge region of the printed circuit board opposite the first edge region.

13. The printed circuit board of claim 1, wherein at least two electrodes of the at least one electrode configuration are loaded with different electric alternating signals.

14. The printed circuit board of claim 1, wherein the evaluation device is operated in at least two operating modes and wherein depending on the operating mode of the evaluation device a number of the electrodes of the at least one electrode configuration is operated as a transmitting electrode or as a receiving electrode.

15. The printed circuit board of claim 1, wherein the printed circuit board is a double-sided printed circuit board and wherein at least one of the electrodes of the at least one electrode configuration is arranged at an upper side of the printed circuit board and remaining electrodes of the at least one electrode configuration are arranged at a lower side of the printed circuit board.

16. The printed circuit board of claim 1, wherein the printed circuit board is designed at least partially flexible.

17. The printed circuit board of claim 1, wherein on the printed circuit board at least one further electrode is arranged on the respective surface region of the edge perpendicular to the at least one electrically conductive layer of the printed circuit board, wherein the at least one further electrode is coupled with at least one electrode of the at least one electrode configuration in a capacitive or galvanic manner.

18. The printed circuit board of claim 17, wherein the at least one further electrode is formed by an electrically conductive lacquer applied to the respective surface region of the printed circuit board.

19. The printed circuit board of claim 1, wherein at least one electrode of the at least one electrode configuration extends all the way to the edge to be exposed on the respective surface region of the edge.

20. The printed circuit board of claim 1, wherein all electrodes of the at least one electrode configuration extend all the way to the edge to be exposed on the respective surface region of the edge.

21. The printed circuit board of claim 1, wherein the at least one electrode configuration has a third electrode arranged between the upper electrode and the lower electrode, wherein the upper electrode or the lower electrode is operated as a transmitting electrode and the respective other electrode is operated as a receiving electrode, and wherein the third electrode is a ground electrode and comprises a size larger than the size of either the one upper electrode and the one lower electrode.

22. The printed circuit board of claim 1, wherein at least one electrode of the at least one electrode configuration is operated as a loading electrode.

23. The printed circuit board of claim 1, the upper electrode and the lower electrode of the at least one electrode configuration are operated as transmitting electrodes.

24. The printed circuit board of claim 1, the upper electrode and the lower electrode of the at least one electrode configuration are operated as receiving electrodes.

25. The printed circuit board of claim 1, comprising two electrode configurations wherein one electrode of a first electrode configuration is operated as a transmitting electrode and one electrode of a second electrode configuration is operated as a receiving electrode.

26. The printed circuit board of claim 25, comprising wherein the two electrode configurations are arranged within opposite edge regions of the printed circuit board.

27. An electric handheld device, comprising at least one printed circuit board on which an evaluation device is arranged and which comprises at least one electrode configuration of a capacitive sensor, wherein the at least one electrode configuration has at least two electrodes arranged one above the other and spaced apart from each other, wherein each of the at least two electrodes can be operated as a transmitting electrode or as a receiving electrode, wherein each electrode is formed by portions of at least one electrically conductive layer of the printed circuit board, and wherein the at least two electrodes of the at least one electrode configuration are coupled with the evaluation device via a conductor path of the printed circuit board, wherein the at least one electrode configuration is only arranged in an edge region of the printed circuit board such that each of the at least two electrodes of the at least one electrode configuration only extends within the edge region of the printed circuit board to or near the edge of the printed circuit board wherein a respective surface region of the edge perpendicular to the at least one electrically conductive layer of the printed circuit board forms the capacitive sensor.

28. The electric handheld device of claim 27, wherein at least one electrode of the at least one electrode configuration extends all the way to the edge to be exposed on the respective surface region of the edge.

\* \* \* \* \*